United States Patent [19]
Gabara

[11] Patent Number: 5,396,195
[45] Date of Patent: Mar. 7, 1995

[54] LOW-POWER-DISSIPATION CMOS OSCILLATOR CIRCUITS

[75] Inventor: Thaddeus J. Gabara, Murray Hill, N.J.

[73] Assignee: AT&T Corp., Murray Hill, N.J.

[21] Appl. No.: 165,433

[22] Filed: Dec. 13, 1993

[51] Int. Cl.$^6$ .......................... H03B 5/12; H03B 5/18
[52] U.S. Cl. .................. 331/113 R; 331/117 FE; 331/117 D
[58] Field of Search ........ 331/117 FE, 117 R, 117 D, 331/113 R

[56] References Cited

FOREIGN PATENT DOCUMENTS 3-29504 2/1991 Japan ........................... 331/117 FE

OTHER PUBLICATIONS

N. M. Nguyen et al, "A 1.8–GHz Monolithic LC Voltage–Controlled Oscillator", Mar. 1992, pp. 444–450, IEEE Journal of Solid–State Circuits, vol. 27, No. 3.

J. Y. C. Chang et al, "Large Suspended Inductors on Silicon and Their Use in a 2–Micometer CMOS RF Amplifier", May 1993, pp. 246–248, IEEE Electron Device Letters, vol. 14, No. 5.

Primary Examiner—Siegfried H. Grimm

[57] ABSTRACT

Low-power-dissipation CMOS oscillator circuits include inductors and capacitors forming tank circuitry. Cross-connected MOS devices provide positive feedback to replenish losses in the tank circuitry and thereby sustain oscillations. Each such oscillator circuit simultaneously generates complementary output sine-wave signals.

13 Claims, 2 Drawing Sheets

LOW-POWER-DISSIPATION CMOS OSCILLATOR CIRCUITS

BACKGROUND OF THE INVENTION

This invention relates to oscillator circuits and, more particularly, to low-power-dissipation oscillator circuits fabricated in integrated-circuit (IC) form utilizing complementary metal-oxide-semiconductor (CMOS) technology.

Oscillators are used in a wide variety of electronic equipment to provide timing or clock signals. As the trend to miniaturize such equipment in IC form has increased, so too has the desire to provide oscillator circuits in a compatible form. In particular, equipment designers recognized that it would be advantageous to have available oscillators capable of being fabricated in CMOS, which is generally the currently preferred technology for making IC circuit chips.

Additionally, the growing importance of wireless communication systems has put considerable emphasis on the need to design all the component parts of the IC equipment in such systems to exhibit especially low power-dissipation characteristics. In fact, the longevity of the power supplies (batteries) included in these systems is often an important determinant of their usefulness. And, even in wired systems, low-power-dissipation oscillators are advantageous, particularly in very-large-scale IC chips where heat dissipation is often a critical consideration in their design.

Furthermore, in many systems of practical importance, it is desirable that each oscillator circuit therein be capable of generating a clock or timing signal and, in synchronism therewith, a complementary version of the signal. In that way, the oscillator simultaneously provides two output signals that are exactly 180 degrees out of phase with respect to each other. The availability of such out-of-phase reference signals enables, for example, simultaneous gating or timing of both p-channel and n-channel devices in a CMOS-based system.

Thus, it was recognized that a need existed for low-power-dissipation oscillator circuits made in CMOS and capable of simultaneously providing complementary output signals. It was apparent that such circuits, if available, would be of significant practical importance in the expanding field of wireless communication systems as well as in the field of wired systems.

SUMMARY OF THE INVENTION

In accordance with one embodiment of the principles of the present invention, an oscillator comprises cross-connected metal-oxide-semiconductor (MOS) devices of one conductivity type and an associated tank circuit that includes capacitors and two inductors. In a second embodiment of the invention, an oscillator comprises cross-connected MOS devices of one conductivity type and an associated tank circuit that includes a single inductor and capacitors. In the second embodiment, two MOS devices of the other conductivity type are respectively connected to the first-mentioned devices to serve as frequency-varying elements.

BRIEF DESCRIPTION OF THE DRAWING

A complete understanding of the present invention and of the above and other features and advantages thereof will be apparent from the detailed description below taken in conjunction with the accompanying drawing, not drawn to scale, in which.

DETAILED DESCRIPTION

Figure 1:
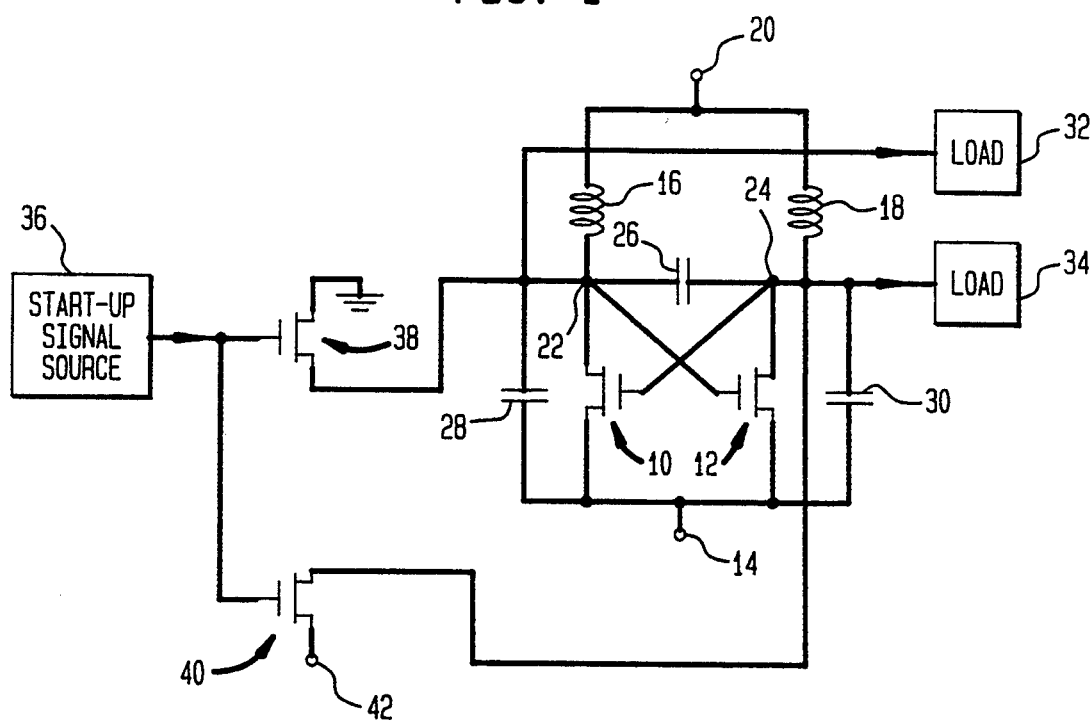
FIG. 1 is a schematic circuit diagram of a specific illustrative embodiment of the principles of the present invention.

The specific illustrative oscillator circuit shown in FIG. 1 comprises two conventional n-channel MOS devices 10 and 12 made in IC form utilizing, for example, 0.9 micrometer design rules. Herein, for purposes of a particular example, the devices 10 and 12 are assumed to be substantially identical to each other. Further, each device is assumed to have a width of about 50-to-100 micrometers and to have an electrical gate length of approximately 0.75 micrometers.

The lower or source electrode of each of the devices 10 and 12 of FIG. 1 is connected to a source or power supply 14. The source 14 will be designated herein as $V_{SS}$ and will, illustratively, be assumed to be a direct-current supply having a value of about $-5.0$ volts. The upper or drain electrodes of the devices 10 and 12 are connected through respective inductors 16 and 18 to a source 20. Herein, the source 20 will be designated $V_{SS}/2$ and will, for example, be assumed to have a value of about $-2.5$ volts.

In accordance with the invention, the gate electrode of the right-hand MOS device 12 of FIG. 1 is directly connected to the drain electrode of the left-hand MOS device 10 at a node point 22. Similarly, the gate electrode of the left-hand MOS device 10 is directly connected to the drain electrode of the right-hand device 12 at a node point 24.

A capacitor 26 is directly connected between the node points 22 and 24 shown in FIG. 1. Two additional capacitors 28 and 30 are indicated as being connected between the node points 22 and 24 and the source 14. The inductors 16 and 18 and the capacitors 26, 28 and 30 constitute an LC tank circuit for the depicted oscillator.

The circuit of FIG. 1 provides a sine-wave voltage output at the node point 22 and a complementary such output at the node point 24. In other words, the sine waves provided at the node points 22 and 24 are 180 degrees out of phase with respect to each other.

The output appearing at the node point 22 of FIG. 1 is connected to a load 32, while the output at the node point 24 is connected to a load 34. Illustratively, both loads are capacitive in nature. Advantageously, the loads 32 and 34 are, for example, MOS devices included in a network which is controlled by the signals generated at the node points 22 and 24.

In a specific illustrative embodiment of the FIG. 1 circuit designed to provide a sine-wave output at a frequency of about 1.2 gigahertz (GHz), each of the inductors 16 and 18 of FIG. 1 has a value of approximately 1.0 nanoHenries. A particularly advantageous way of achieving such inductors with controlled values and in a miniature form compatible with the IC chips containing the remainder of the circuit will be described later below in connection with the description of FIG. 5.

The capacitors shown in FIG. 1 can be realized in a variety of standard ways. Thus, for example, the metal-oxide-metal layers typically included in an IC design are available for forming the required capacitors. Or the thin gate-oxide capacitance of an n- or p-channel MOS device may be utilized for making the capacitors. Additionally, parasitic capacitances inherent in the circuit, as well as the capacitances of the loads that are driven by the circuit, provide capacitance that contribute to the values of the frequency-determining components of the circuit.

In the specific illustrative example mentioned above in which the frequency of operation of the FIG. 1 circuit is approximately 1.2 GHz, the capacitor 26 connected between the node points 22 and 24 has a value of about 4.0 picoFarads (pF). Each of the capacitors 28 and 30 is shown as a single discrete component. In practice, however, these components also include parasitic and load capacitances in parallel therewith. In one particular illustrative circuit designed to operate at 1.2 GHz, the total value of the overall capacitance connected to each of the node points 22 and 24 was established to be about 0.5 pF.

In practice, the inductors and capacitors included in a CMOS version of FIG. 1 designed to operate at 1.2 GHz form a tank circuit characterized by relatively low-loss characteristics. Illustratively, one such tank circuit exhibited a quality factor or Q of about 15-to-20. Significantly, the power dissipated by such a circuit was only approximately 27 milliWatts. By contrast, generating such signals utilizing conventional MOS or CMOS techniques would typically dissipate about 250 milliWatts.

To ensure reliable operation of the FIG. 1 circuit, it is advantageous to provide start-up circuitry to drive the depicted circuit into its steady-state oscillatory mode. By way of example, such start-up circuitry includes a start-up signal source 36 and n-channel MOS devices 38 and 40, as shown in FIG. 1.

The drain electrode of the device 38 of FIG. 1 is connected to a point of reference potential such as ground, and the source electrode thereof is connected to the node point 22. Further, the source electrode of the device 40 is connected to a source 42 having the same value as that of the source 14, and the drain electrode thereof is connected to the node point 24. And the gate electrodes of both of the devices 38 and 40 are connected to the output of the start-up signal source 36.

The start-up signal source 36 of FIG. 1 applies either $V_{SS}$ (−5.0 volts) or 0 volts (ground) to the gates of the MOS devices 38 and 40. As long as −5.0 volts is applied to their gates, the devices 38 and 40 are nonconductive and the start-up circuitry is in effect disabled.

Initially, with the start-up circuitry disabled but the remainder of the circuit shown in FIG. 1 energized, it is possible that the voltages at the node points 22 and 24 will assume a condition in which they are approximately equal. In that case, the currents through the inductors 16 and 18 will also be approximately equal. As a result, the circuit would remain in a balanced or non-oscillatory steady-state condition.

By applying a start-up signal to the FIG. 1 circuit, the circuit is unequivocally driven into its desired oscillatory state. The idealized waveform 44 of such a start-up signal, occuring in the time period $t_1$-to-$t_2$, is shown in FIG. 3.

The application of the start-up signal 44 (FIG. 3) to the gates of the MOS devices 38 and 40 causes these devices to be rendered conductive. As a result, the voltage of the node point 22 is driven in a positive direction while the voltage of the node point 24 is driven in a negative direction. At the same time, the current through the inductor 16 decreases while the current through the inductor 18 increases. In that way, the initially balanced condition of the circuit is altered by the start-up signal.

Figure 3:
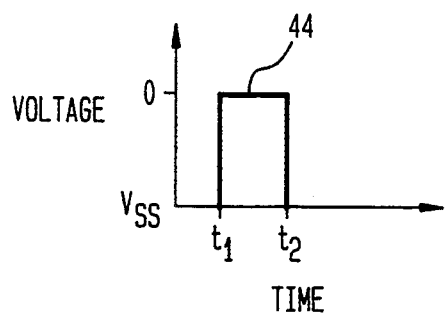
FIG. 3 shows the waveform of a start-up signal suitable for application to the circuits of FIGS. 1 and 2.

When the start-up signal 44 of FIG. 3 returns to the value $V_{SS}$ (at time $t_2$), the devices 38 and 40 in the start-up circuitry are rendered nonconductive. At that time, the oscillator circuit is in an unbalanced condition, with energy stored in the inductors 16 and 18 and the capacitors 26, 28 and 30. Subsequently, due to the energy stored in the tank circuit and the regenerative feedback action of the cross-connected MOS devices 10 and 12, oscillations build up until, at time $t_3$, output sine-wave signal 46 appears at the node point 22 and complementary output sine-wave signal 48 appears at the node point 24, as indicated in FIG. 4.

Figure 4:
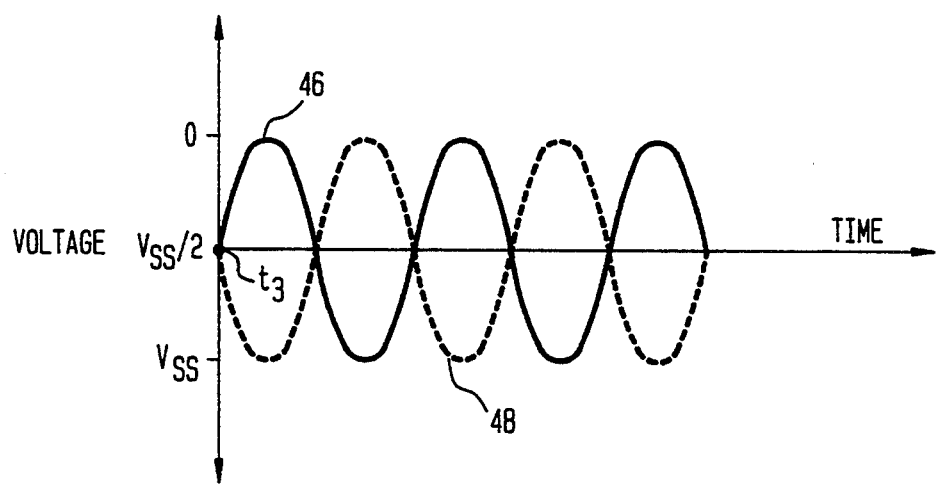
FIG. 4 depicts the form of the complementary output signals derived from the circuits of FIGS. 1 and 2.

Each of the sine waves 46 and 48 of FIG. 4 has a maximum value of 0 volts and a minimum value of $V_{SS}$ (−5.0 volts). The mid-point of each sine wave occurs at $V_{SS}/2$. And the two sine waves are 180 degrees out of phase with respect to each other.

Figure 2:
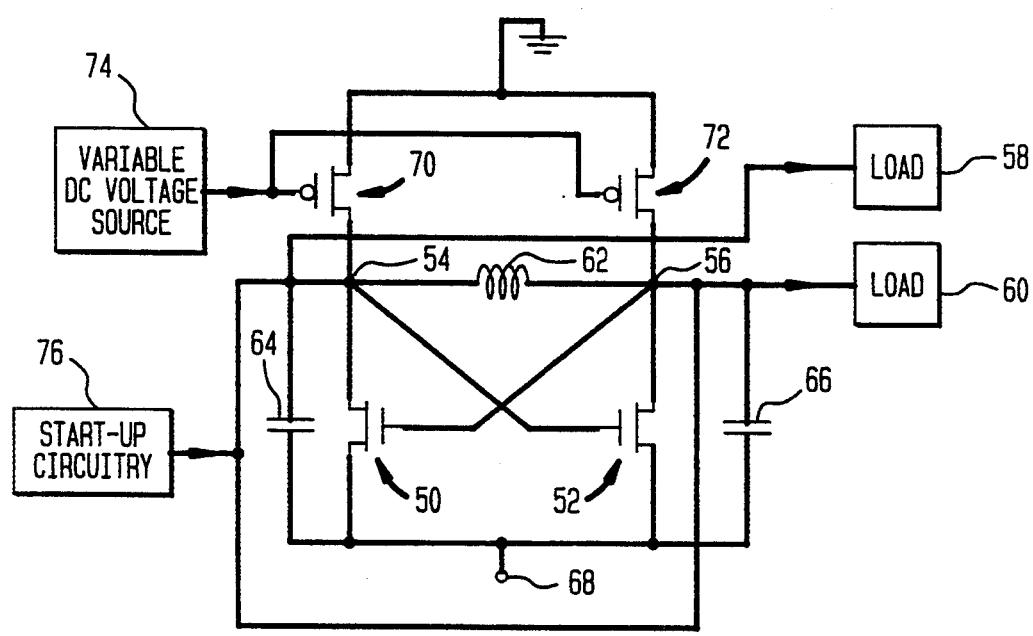
FIG. 2 is a schematic circuit diagram of another specific illustrative embodiment of the invention.

The oscillator circuit shown in FIG. 2 is similar to the FIG. 1 circuit. Thus, the FIG. 2 arrangement also includes cross-connected n-channel MOS devices, which are designated by reference numerals 50 and 52. In FIG. 2, output nodes 54 and 56 are connected to loads 58 and 60, respectively. An inductor 62 (rather than a capacitor as in FIG. 1) is connected between the output node points. The inductor 62 together with capacitors 64 and 66 constitute the tank circuit of the FIG. 2 arrangement.

Further, the source electrodes of the devices 50 and 52 of FIG. 2, as well as the bottom plates of the capacitors 64 and 66, are connected to a source 68 which is designated $V_{SS}$. Illustratively, the source 68 has a value of approximately −5.0 volts.

The oscillator circuit of FIG. 2 also includes p-channel MOS devices 70 and 72 respectively connected between a point of reference potential such as ground and the drain electrodes of the devices 50 and 52. By varying the direct-current voltage applied to the gate electrodes of the devices 70 and 72, it is possible to change the frequency at which the depicted circuit oscillates. A source 74 for accomplishing this frequency variation is shown in FIG. 2.

Advantageously, the circuit of FIG. 2 also includes start-up circuitry 76 of the same type described above and included in the FIG. 1 circuit. In that way, the circuit of FIG. 2 is controlled to achieve a steady-state oscillatory condition of the type represented in FIG. 4.

In one specific illustrative example, the circuit of FIG. 2 was designed to operate at 1.2 GHz, when the bias applied to the gates of the devices 70 and 72 was −5.0 volts. In that case, the value of the inductor 62 was 10.0 nH and each of the capacitors 64 and 66 represents a total capacitance of 6.5 pF connected to the node points 54 and 56, respectively. By varying the output voltage of the source 74 between −5.0 and −2.0 volts, it is possible to realize a frequency variation of about plus or minus 25 MHz. Significantly, under these conditions the depicted oscillator circuit exhibited a power dissipation characteristic of only about 27 mW.

For operation at high frequencies such as 1.2 GHz, the relatively small values of inductance required for the inductors 16, 18 and 62 shown in FIGS. 1 and 2 can be realized in a variety of ways. One advantageous way of making such inductors is to form a conductive pattern on an insulating substrate, as illustratively represented in FIG. 5.

Figure 5:
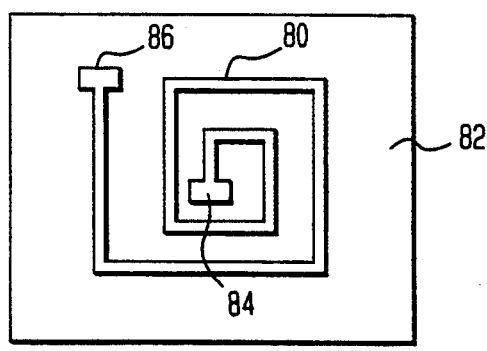
FIGS. 5 and 6 represent one illustrative way in which an inductor may be realized in the circuits of FIGS. 1 and 2.
Figure 6:
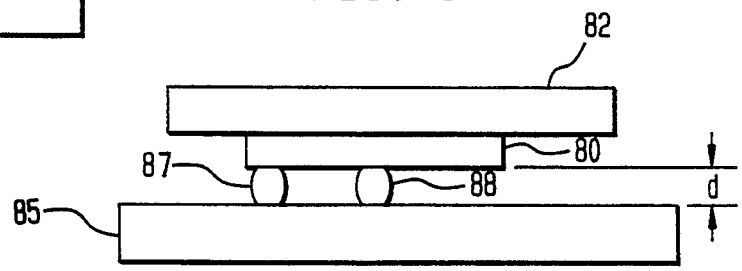

FIG. 5 is a top view of a conductive pattern 80 made, for example, of aluminum which is adhered to an insulating substrate 82 made, for example, of quartz. The pattern 80 constitutes an inductor. Illustratively, the respective ends of the inductor 80 are enlarged to form pads 84 and 86. By means of these pads, the ends of the inductor can be connected to other components in a circuit, as indicated in FIG. 6. Of course, it is feasible to form more than one inductor on the substrate 82.

FIG. 6 shows the inductor of FIG. 5 arranged topside down in close proximity to an IC chip 85 that contains a circuit into which the inductor is to be connected. Illustratively, connections are made between the pads 84 and 86 (FIG. 5) of the inductor and standard mating connection pads (not shown) on the chip 85 by means of conventional microminiature solder bumps 87 and 88.

In one specific illustrative example, the distance d (FIG. 6) between the bottom surfaces of the pads on the conductive pattern 80 and the top surfaces of the mating connection pads on the chip 85 is defined by the solder bumps 87 and 88 to be only about 100 micrometers. In that way, the inductance added to the circuit on the IC chip 85 is determined primarily by the predetermined design of the conductive pattern 80. Achieving specified small values of inductance in a highly controlled and reproducible manner is thereby facilitated.

Finally, it is to be understood that the above-described arrangements are only illustrative of the principles of the present invention. In accordance with these principles, numerous modifications and alternatives may be devised by those skilled in the art without departing from the spirit and scope of the invention. Thus, for example, while the specific illustrative oscillator circuits described above comprise cross-connected n-channel MOS devices and n-channel MOS devices in the associated start-up circuitry, it is apparent that p-channel MOS devices may be substituted therefor, with an accompanying straightforward change in the polarities of the various required power supplies. If cross-connected p-channel devices are utilized in the FIG. 2 arrangement, the associated frequency-varying elements 70 and 72 would be n-channel devices.

What is claimed is:

1. An oscillator circuit comprising
   first and second MOS devices of one conductivity type, each of said devices including source, drain and gate electrodes,
   means directly connecting the drain electrode of said first device to the gate electrode of said second device and directly connecting the drain electrode of said second device to the gate electrode of said first device,
   and tank circuitry comprising at least one inductor and capacitors connected to said source and drain electrodes.

2. An oscillator circuit as in claim 1 further including means for connecting said source and drain electrodes to a source of potential.

3. An oscillator as in claim 2 wherein said tank circuitry comprises
   a capacitor directly connected between said drain electrodes, capacitors respectively connected between the source and drain electrodes of each of said devices,
   and inductors respectively connected between said drain electrodes and said source of potential.

4. An oscillator circuit as in claim 3 further including start-up circuitry connected to said drain electrodes.

5. An oscillator circuit as in claim 2 wherein said tank circuit comprises
   an inductor directly connected between said drain electrodes,
   and capacitors respectively connected between the source and drain electrodes of each of said devices.

6. An oscillator circuit as in claim 5 wherein first and second MOS devices of the other conductivity type have their source-to-drain paths respectively connected between said source of potential and the drain electrodes of said first and second devices of said one conductivity type.

7. An oscillator circuit as in claim 6 further including a variable source of direct-current voltage connected to the gate electrodes of the devices of said other conductivity type.

8. An oscillator circuit as in claim 7 further including start-up circuitry connected to the drain electrodes of said first and second devices of said one conductivity type.

9. An oscillator circuit comprising
   first and second MOS devices of one conductivity type, each of said devices including source, drain and gate electrodes,
   means directly connecting the drain electrode of said first device to the gate electrode of said second device and directly connecting the drain electrode of said second device to the gate electrode of said first device,
   a reactive element connected between the drain electrodes of said first and second devices,
   and means including additional reactive elements for connecting the source and drain electrodes of said first and second devices to associated power sources.

10. An oscillator circuit as in claim 9 wherein said first-mentioned reactive element comprises a capacitor.

11. An oscillator circuit as in claim 10 wherein said additional reactive elements comprise
   a capacitor and an inductor each connected to the drain electrode of said first device and adapted to be connected to said power sources,
   and an additional capacitor and an additional inductor each connected to the drain electrode of said second device and adapted to be connected to said power sources.

12. An oscillator circuit as in claim 9 wherein said first-mentioned reactive element comprises an inductor.

13. An oscillator circuit as in claim 12 wherein said additional reactive elements comprise
   a capacitor connected to the drain electrode of said first device and adapted to be connected to said power sources,
   and an additional capacitor connected to the drain electrode of said second device and adapted to be connected to said power sources.

* * * * *